United States Patent [19]
Upton et al.

[11] Patent Number: 5,351,197
[45] Date of Patent: Sep. 27, 1994

[54] METHOD AND APPARATUS FOR DESIGNING THE LAYOUT OF A SUBCIRCUIT IN AN INTEGRATED CIRCUIT

[75] Inventors: Michael D. Upton, Seattle; Thomas F. Rossman, Kirkland; Dean P. Frazier, Bellevue; Jay S. Fuller; Kendall C. Russell, both of Issaquah, all of Wash.

[73] Assignee: Cascade Design Automation Corporation, Bellevue, Wash.

[21] Appl. No.: 824,707

[22] Filed: Jan. 21, 1992

Related U.S. Application Data

[63] Continuation of Ser. No. 337,232, Apr. 13, 1989, abandoned.

[51] Int. Cl.5 .............................................. G06F 15/60
[52] U.S. Cl. ................................... 364/491; 364/490; 364/489; 364/488
[58] Field of Search ................ 364/488, 489, 490, 491

[56] References Cited

U.S. PATENT DOCUMENTS

| | | | |
|---|---|---|---|
| 3,653,071 | 3/1972 | Hill et al. | 364/491 |
| 4,554,625 | 11/1985 | Otten | 364/491 |
| 4,580,228 | 4/1986 | Noto | 364/491 |
| 4,600,995 | 7/1986 | Kinoshita | 364/491 |
| 4,613,940 | 8/1986 | Shenton et al. | 364/491 |
| 4,615,011 | 9/1986 | Linsker | 364/491 |
| 4,630,219 | 12/1986 | DiGiacomo et al. | 364/488 |
| 4,635,208 | 1/1987 | Coleby et al. | 364/491 |
| 4,651,284 | 3/1987 | Watanabe et al. | 364/491 |

OTHER PUBLICATIONS

A. J. Kessler et al., "Standard Cell VLSI Design: A Tutorinal," IEEE Circuits & Devices Magazine, Jan. 1985, pp. 17-33.

A. D. Lopez et al., "A Dense Gate Matrix Layout Method for MOS LSI," IEEE Trans. Electron Devices, vol. ED-27, pp. 1671-1675, Aug. 1980.

*Primary Examiner*—Vincent N. Trans
*Attorney, Agent, or Firm*—Graybeal Jackson Haley & Johnson

[57] ABSTRACT

A method and apparatus for determining integrated circuit layouts of a random access memory (RAM) from a virtual circuit description and specification of a process technology. Starting with high-level descriptions of a circuit, a virtual geometric description of the circuit is developed in terms of reference points relative to a substrate surface. When the process technology is specified, the relationships among the reference points is determined, as in the layout of the RAM. These relationships account for variable sizing of circuit features and pitch matching of circuit features. A connectivity model and a simulation model of the RAM are also produced by the method and apparatus. These model can be used to verify that the RAM is connected as desired and has the desired performance.

9 Claims, 14 Drawing Sheets

RAM CELLS BEFORE PITCH MATCHING

RAM CELLS AFTER PITCH MATCHING

METHOD AND APPARATUS FOR DESIGNING THE LAYOUT OF A SUBCIRCUIT IN AN INTEGRATED CIRCUIT

CROSS-REFERENCE TO RELATED APPLICATION

This application is a continuation of U.S. application Ser. No. 07/337,232, filed Apr. 13, 1989, now abandoned.

TECHNICAL FIELD

This invention relates to integrated circuit design tools. More particularly, this invention relates to a symbolic and dynamic method for designing, modeling, and checking the performance of the layout of a subcircuit in an integrated circuit and an apparatus for implementing such method.

BACKGROUND ART

A monolithic integrated circuit is a combination of interconnected subcircuits containing circuit elements that are inseparably associated on or within a continuous substrate. Typically, the circuit elements are conventional components, transistors, diodes, capacitors, and resistors fabricated in situ within or on a single crystal of semiconductor material with the capability of performing a complete electronic circuit function.

In practice, an integrated circuit is designed in a top-down method by first designing a logic level drawing and a transistor level drawing. These drawings then are used to design the more detailed integrated circuit layout, which shows the IC layers (i.e.,, metal, polysilicon, and active, and the ways the layers interrelate to form transistor gates, wires, contact points, etc.). The integrated circuit layout, often referred to as "geometry," is used to generate the integrated circuit tooling, which is a series of masks, each representing a layer for the integrated circuit. The tooling is then used by manufacturers to fabricate an integrated circuit.

Typically, monolithic integrated circuits are fabricated by a process of photolithography, doping, and material deposition. Photolithography is any technique whereby light or other electromagnetic rays are shone through a mask to create a pattern on a silicon wafer coated with a photosensitive film. Doping includes those techniques for treating the exposed areas in the pattern to take on n- or p-type characteristics to form components of transistors and diodes. "Material deposition" refers to the growth or deposit of photoresist, insulating oxide, metal, polysilicon, and other materials that form the topology of the circuit.

In one method for fabricating an integrated circuit, a layer of photoresistive material is deposited on a semiconductor wafer. A mask for the integrated circuit is then placed over the layer of photoresistive material and light is shone through the mask to activate parts of the photoresistive material. This leaves a predetermined pattern of conductors on the wafer and exposed areas of the wafer between the conductors. Transistors and diodes are formed by doping portions of the exposed areas of the wafer with a chemical doping agent. A second mask can then be used to generate another pattern of conductors and exposed areas which are, once again, doped.

Additional doping layers may also be used. After each doping step, the photoresistive material is chemically removed from the wafer. When the final doping layer has been completed, a pattern of exposed areas of the wafer is once again formed by exposing a layer of photoresist on the wafer through a mask. A layer of metal or other suitable conductor is then deposited onto portions of the exposed areas of the semiconductor wafer to form the desired interconnections between components on the wafer. Though there are many fabrication technologies, fabrication techniques, and integrated circuit materials, fabricating the design for the integrated circuit through one or more masks is used consistently.

Depending on the fabrication technologies and techniques, and the materials used, different configuration constraints apply. These constraints are commonly referred to as "geometric design rules" or "design rules." Design rules include, for example, specifications for minimum spacing between transistors and minimum separation between conductors to prevent shorting, specifications for minimum metal width, and specifications for maximum metal heights and slopes of walls which form metal junctions.

With the continued improvement of fabrication technologies and techniques and the development of new materials used in defining electronic circuits, design rules are changing to allow for smaller and smaller spacings between materials on an integrated circuit and to allow smaller and smaller substrate areas. Thus design rules may change during the development process of any particular circuits. Because increases in the die size of a mask by fifteen percent typically result in a doubling of the cost of an integrated circuit, minimal substrate areas are desired.

Once the layout of a subcircuit has been determined, a designer would like to be assured that the wire connections of the layout are correct. This can be accomplished by comparing a transistor model of the layout with the connectivity of the original subcircuit. After the connectivity of the layout has been verified, its performance can be studied by means of a behavior simulation model. Such a simulation model includes a timing model for each cell of the subcircuit, including both digital and analog circuitry.

In U.S. Pat. No. 4,635,208, issued Jan. 6, 1987, Coleby et al. describe a method for computer-aided design of systems which binds three aspects of a circuit together. The three aspects bound together in the disclosure of the Coleby et al. patent are the circuit's logical model, its electrical circuit layout, and its mechanical design. By binding these three aspects together, Coleby et al. disclose a graphical, computer-performed method in which changes in any one of the three aspects of the system are reflected in changes in all of the three aspects and in their documentation.

In their patent, Coleby et al. do not disclose a system for establishing the constraints that are determined by a specified process technology. Neither do they disclose creating a layout geometry for the subcircuit according to the constraints. This follows naturally since they have not disclosed a system for establishing the constraints.

However, Coleby et al. do disclose steps of generating one or more simulation models for the layout geometry and generating a connectivity test model for the layout geometry that are known in the prior art. Specifically, FIG. 2 of the Coleby et al. patent, as described beginning on line 27 of its column 3, depicts a typical prior art technique for designing an electrical circuit with computer graphic techniques. This typical prior art technique includes designing an electrical schematic and extracting a net list (designating the connectivity of the circuit) therefrom. Simulation is performed on the mechanical layout. However, this typical prior art technique does not disclose, and cannot disclose, the steps of designing an electrical schematic and extracting a net list therefrom unless the layout geometry is established, and the layout geometry cannot be created until the constraints that are determined by a specific process technology are established.

In "Standard Cell VLSI Design: A Tutorial," IEEE Circuits and Devices Magazine, January 1985, pp. 17-33, Kessler et al. describe a very large scale integrated (VLSI) circuit design using standard cells. The layout of a standard cell, as stated in column 2 of page 17 of the Kessler et al. article, implies the interconnection of predefined and pre-laid out function blocks using a routing program.

Using a standard cell approach obviates both the need to establish the constraints that are determined by a specified process technology and the need to create a layout geometry for a circuit according to the constraints. The reason is that these steps are performed when a standard cell library is developed and recorded for later use. Accordingly, a person skilled in the art clearly knew in 1985 to specify a connectivity file from the layout geometry and then to use the connectivity file to generate one or more simulation models for the layout geometry. This is shown in FIG. 2 of the Kessler et al. article and in the corresponding text beginning with the heading "Schematic Capture of Design Intent" in column 1 of page 22. Accordingly, calculating the connectivity of each of the features of a particular layout and developing a simulation model of the timing performance of each of the models was known to a person skilled in the art as of January 1985.

While it has been known in the past to verify the connectivity of a given layout from the desired subcircuit, the required transistor model has heretofore been produced manually after the layout has been plotted. Allowing the transistor model to be developed from the module specification before the layout is created avoids the time-consuming task of producing the layout and rendering the transistor model from that layout. In addition, it is no longer necessary to develop the timing model from a plot of the layout after the connectivity of the layout has been verified, since the layout is dependent upon the process technology.

After a layout satisfying all of the constraint requirements has been developed, certain features on the layout can typically be enlarged and/or moved within the layout without changing the overall dimensions of the subcircuit. Heretofore, these desirable steps were necessarily handled on a one-by-one basis after the layout had been developed. In circuits and subcircuits of the complexity fostered by very large scale integration, this process can be tedious and time-consuming. It is therefore desirable to perform such steps rapidly after a layout has been initially designed.

DISCLOSURE OF THE INVENTION

An object of this invention is to provide a method and an apparatus for designing the layout of a subcircuit on an integrated circuit, the method and apparatus being independent of the design constraints imposed by materials and/or fabrication technologies.

Another object of this invention is to provide a method and an apparatus for designing the layout of a subcircuit on an integrated circuit, certain parameters of the subcircuit, such as the number of bits in a word of data, being determined by the user.

A further object of this invention is to provide a method and an apparatus for designing the layout of a subcircuit on an integrated circuit, wherein internal cells of the subcircuit are sized to optimize performance.

Yet another object of this invention is to provide a method and an apparatus for designing the layout of a subcircuit on an integrated circuit, wherein internal cells of the subcircuit are sized to optimize reliability.

A still further object of this invention is to provide a method and apparatus for designing the layout of a subcircuit on an integrated circuit, including automatically sizing critical transistors to maximize the operating margins and speed of a subcircuit.

Yet another object of this invention is to provide a method and an apparatus for designing a layout of a subcircuit on an integrated circuit including creating a reference transistor model from the input specification for checking the connectivity of the layout.

Yet a further object of this invention is to provide a method and an apparatus for designing the layout of a subcircuit on an integrated circuit including creating a simulation model of the layout.

An additional object of this invention is to provide a method and an apparatus for designing the layout of a subcircuit on an integrated circuit including creating a simulation model of the layout which produces simulation parameters to improve the accuracy of the simulation model.

These and other objects of the invention are accomplished by a method for designing the layout of a subcircuit on an integrated circuit by establishing constraints, including geometric constraints, among the layers of the circuit features. The method also comprises creating a layout geometry for the subcircuit according the constraints, generating a connectivity test model for the layout geometry, and generating one or more simulation models for the layout geometry.

Though the method described refers to relatively positioning integrated circuit components and to design rule variables corresponding to positioning constraints for various fabrication technologies and techniques, the method could also be used for relatively positioning other objects and for design rule variables corresponding to other positioning constraints.

Typically, the method is used for designing subportions of an integrated circuit which are then integrated to form an entire integrated circuit layout database. The database is used to form tooling and/or masks for conventional fabrication processes. The subportions may be strategically designed by function, so the geometry may be used as an interchangeable module for various integrated circuit layouts or as a building block in highly complex integrated circuits. Thus, the method is commonly referred to as "module generation."

One apparatus for implementing this invention is a computer system used to host software tools for designing integrated circuits. A subset of the software tools and the methodology for using such subset combine to be the preferred embodiment of the method of this invention. The computer system is used to automate the design process and might include additional software tools for integrating modules, simulating integrated circuit performance, printing geometries, and creating tooling (such as masks).

BRIEF DESCRIPTION OF THE DRAWINGS

FIGS. 8B-1 and 8B-2 are respectively first and second portions of the metal layer mask of a four word by 64-bit, single-port RAM according to FIG. 3.

BEST MODE FOR CARRYING OUT THE INVENTION

HARDWARE

Figure 1:
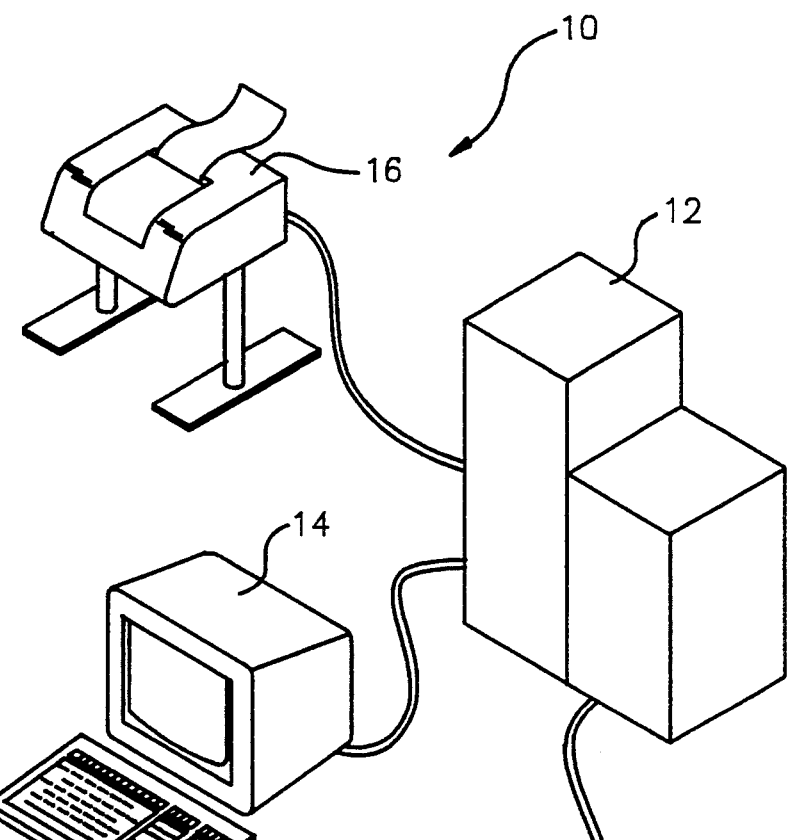
FIG. 1 is a perspective view of an embodiment of the apparatus for designing integrated circuits.

Referring to FIG. 1, the preferred embodiment of the apparatus 10 for designing subcircuits in integrated circuits is a conventional computer system including a computer 12, terminal 14, printer 16, and plotter 18. In one embodiment, the computer is a VAX 11/785, model no. 11785AA, manufactured by Digital Equipment Corporation (DEC); the terminal is an AED 767 monitor terminal manufactured by Advanced Electronic Design, Inc.; the printer may be any one of a large number of available models; and the plotter is an HP 7475A manufactured by Hewlett-Packard, Inc. The VAX 11/785 uses a UNIX version 4.2 operating system and includes an interface program for the AED 767 monitor called "Caesar version 7," developed at the University of California at Berkeley, and a "C" program language generator, developed by Bell Laboratories. In the preferred embodiment, the method for designing integrated circuits is embodied within a Generator Development System (GDS).

SOFTWARE

The computer system 10 includes a set of software tools for designing integrated circuit module generators, each consisting of source code and executable code. The integrated circuit module is an array of cells. Each cell, in turn, is the geometric definition of the required integrated circuit components. Every module can be combined, like a building block, with other modules in order to create a complete geometric description of an integrated circuit and a corresponding mask work.

The preferred embodiment of the method is, in effect, the implementation of a high-level software language referred to as the "Silicon Generator Software Language for Integrated Circuits" (SLIC). Each SLIC command comprises, in one embodiment, a set of "C" language function calls. Thus, the preferred embodiment is a language for writing source code which is to generate executable code. Execution of the executable code results in a specific geometry layout.

The module generator, developed using CDS, may be used with other module generators or alone to develop an integrated circuit layout. Typically, the software tools for developing module generators are used with other software in packages such as the ChipCrafter Generator produced by Seattle Silicon Corporation. These other software tools include programs for interconnecting modules, such as the Pride/Auto Route software tool within the ChipCrafter package.

Typically, a modular approach is used for designing a complex integrated circuit. In this approach, the circuit for each module is designed, tested, and debugged before it is integrated with other modules to form the complete integrated circuit layout and mask work.

Although the preferred embodiment of the method is a software embodiment designed to run on the VAX 11/785 having a Unix Version 4.2 operating system and a "C" compiler, other embodiments of the method could be software programs designed to run on computer systems using other computers, terminals, printers, and plotters with another operating system and programming language. Still other embodiments of the method need not take the form of a computer program or be implemented through a computer system.

SLIC is an extension language of the "C" programming language. SLIC is used to write geometry generator source code for generating a layout. A second extension language, GSSLIC, may be used to write simulation model source code for simulating the performance of the layout design. A third extension language, SSSLIC, may be used to write schematic symbol generator source code for deriving a schematic symbol for the module under development (e.g., the logic symbol for an 'OR' gate with inputs and outputs). Also, a fourth extension language, TSSLIC, may be used to write transistor modules.

METHODOLOGY

Figure 2:
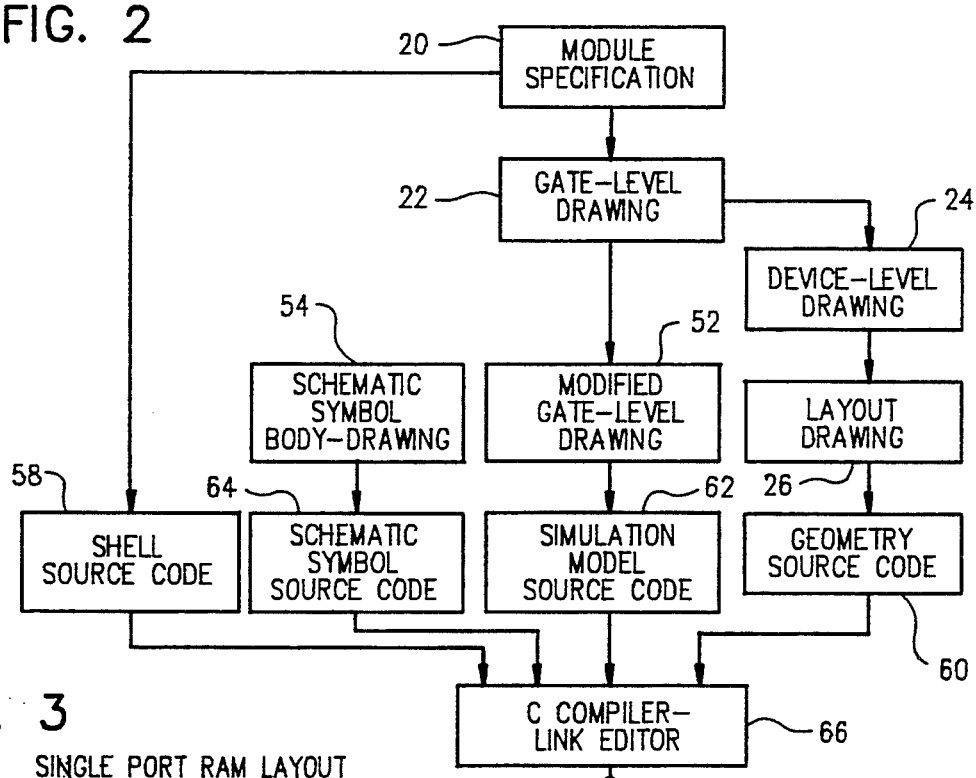
FIG. 2 is a flow diagram showing the steps performed by the compiler-link editor when generating an executable module compiler for producing the integrated circuit layout geometry.

Referring to FIG. 2, the following is a description of the methodology used to design integrated circuit module generators. As a preliminary step, the designer identifies the module specification 20, including the technology to be used (e.g., CMOS or BIPOLAR), the functional characteristics of the circuit, a connection diagram, the approximate dimensions, and the end user input options for the integrated circuit module. The designer then develops preliminary high-level drawings of the integrated circuit. One drawing typically produced by the apparatus 10 (see FIG. 1) is a gate level drawing 22 specifying the circuits with standard gates and interconnections. At the next level, the gates are reduced to their discrete devices (i.e., transistors) in a device level drawing 24. A preliminary layout drawing 26 is then derived from the device level drawing, translating the discrete devices into a physical geometry of layers and components, such as wires, contacts, etc.

Further details of the applicability of this methodology are described fully in U.S. patent application Ser. No. 917,917 filed Oct. 10, 1986 and assigned to the assignee of this application and is hereby incorporated by reference.

Methodology: Module Compiler

Using the module specification 20 (in FIG. 2), the designer may write shell source code in the "C" programming language to define the module, may include a file of design rules, and may also develop an interactive menu to make the completed module compiler "user-friendly."

Using the layout drawing 26 for reference, the designer includes SLIC commands as geometry compiler source code 60. This source code defines the dynamic virtual grid in terms of reference points.

Figure 3:
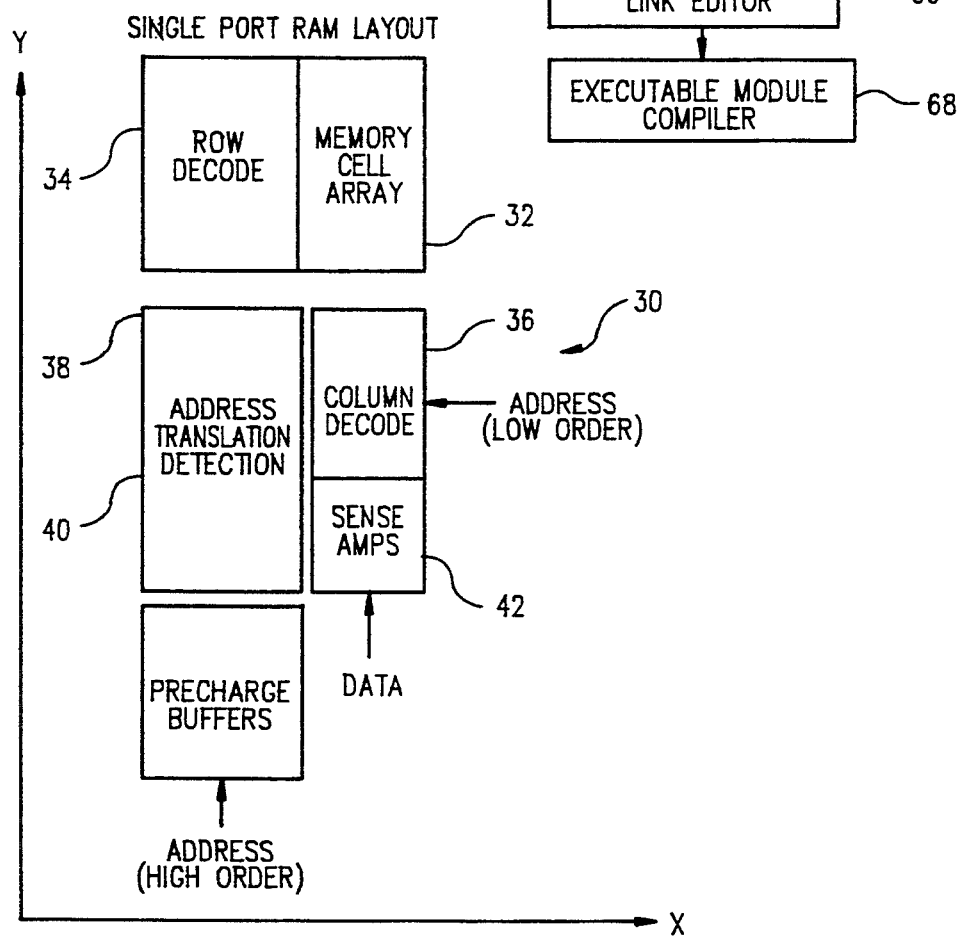
FIG. 3 is a block diagram showing the architecture of a single-port random access memory (RAM).

FIG. 3 is a block diagram of the architecture of an exemplary single-port RAM. The RAM is composed of a number of subcomponents geometrically arranged to facilitate communications between subcomponents where required. The single-port RAM 30 includes a memory cell array 32 containing individual RAM cells arranged in rows and columns. Adjacent to the memory cell array in a horizontal direction (here designated the "X" direction) is a row decode subcomponent 34. The circuitry contained in the row decode 34 selects a particular row in the memory cell array 32 whose contents are to be read from or written into. Adjacent to the memory cell array 32 in the vertical direction (here designated the "Y" direction) is a column decode subcomponent 36. Column decode 36 selects which of the columns in the word occupying the row chosen by the row decode 34 are to be read. This is useful if the memory cell array 32 is folded so that each row can contain more than one word. This may be done automatically by the module compiler to produce a RAM having a desired aspect ratio between its overall vertical and horizontal dimensions. Generally, then, the column decode 36 must accept low order portions of a binary address, although this is not necessary if each row in the memory cell array 32 contains exactly one word.

Vertically adjacent the row decode 34 is an address translation detection (ATD) subcomponent 38. The ATD 38 is connected in the Y direction to a precharged buffers subcomponent 40 which accepts the high order bits of an address. The ATD 38 detects when a change occurs in the address submitted to the precharged buffers 40, and accordingly initiates appropriate action to read or write data to or from the memory cell array 32.

The single-port RAM whose architecture is shown in FIG. 3 is a static RAM (SRAM) which, as is well known to those skilled in the art, has substantially shorter delay times in accessing or storing information than does a dynamic RAM (DRAM). An SRAM also has the advantage of being capable of storing data indefinitely, as long as power supplies to the RAM are maintained. An SRAM, however, occupies a greater area than a corresponding DRAM.

Using the layout drawing 26 (FIG. 2) for reference, an SRAM designer can include SLIC commands as geometry source code 60. This source code defines a set of reference points used for positioning subcomponents. Referring to Table 1, below, the code includes subroutines for calculating the sizes of various features in the subcomponents and for pitch matching corresponding horizontally or vertically aligned features in neighboring subcomponents.

TABLE 1

| | |
|---|---|
| ram2-sizer.c | contains C code for power rail sizing, buffer sizing and pitch matching |
| ram2-midvdd | calculates the size of the internal Vdd bus |
| ram2-mid grid | calculates the size of the internal GROUND BUS |
| ram2-atd-sizer | calculates the size of the output buffer for the ATD cell |
| ram2-word-sizer | calculates the size of the word line buffer |
| ram2-cell-xpitch | finds the maximum width required to fill all of the cells under the RAM array |

Figure 4:
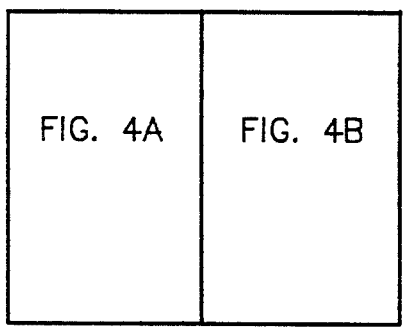
FIG. 4 is a schematic diagram showing the relative placement of FIGS. 4A and 4B.
Figure 4A:
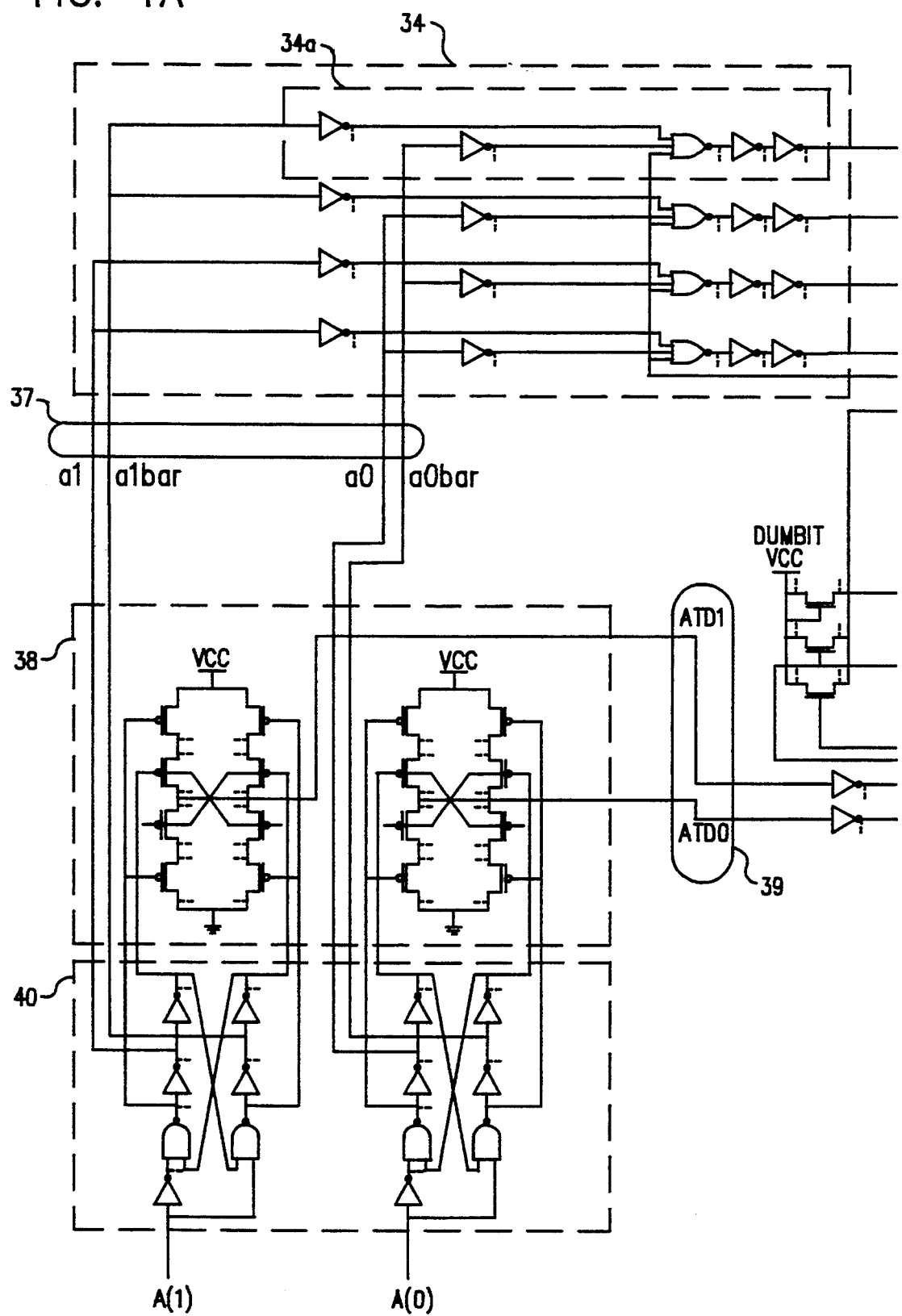
FIGS. 4A and 4B are respectively first and second portions of a schematic diagram of a four word by one-bit RAM.
Figure 4B:
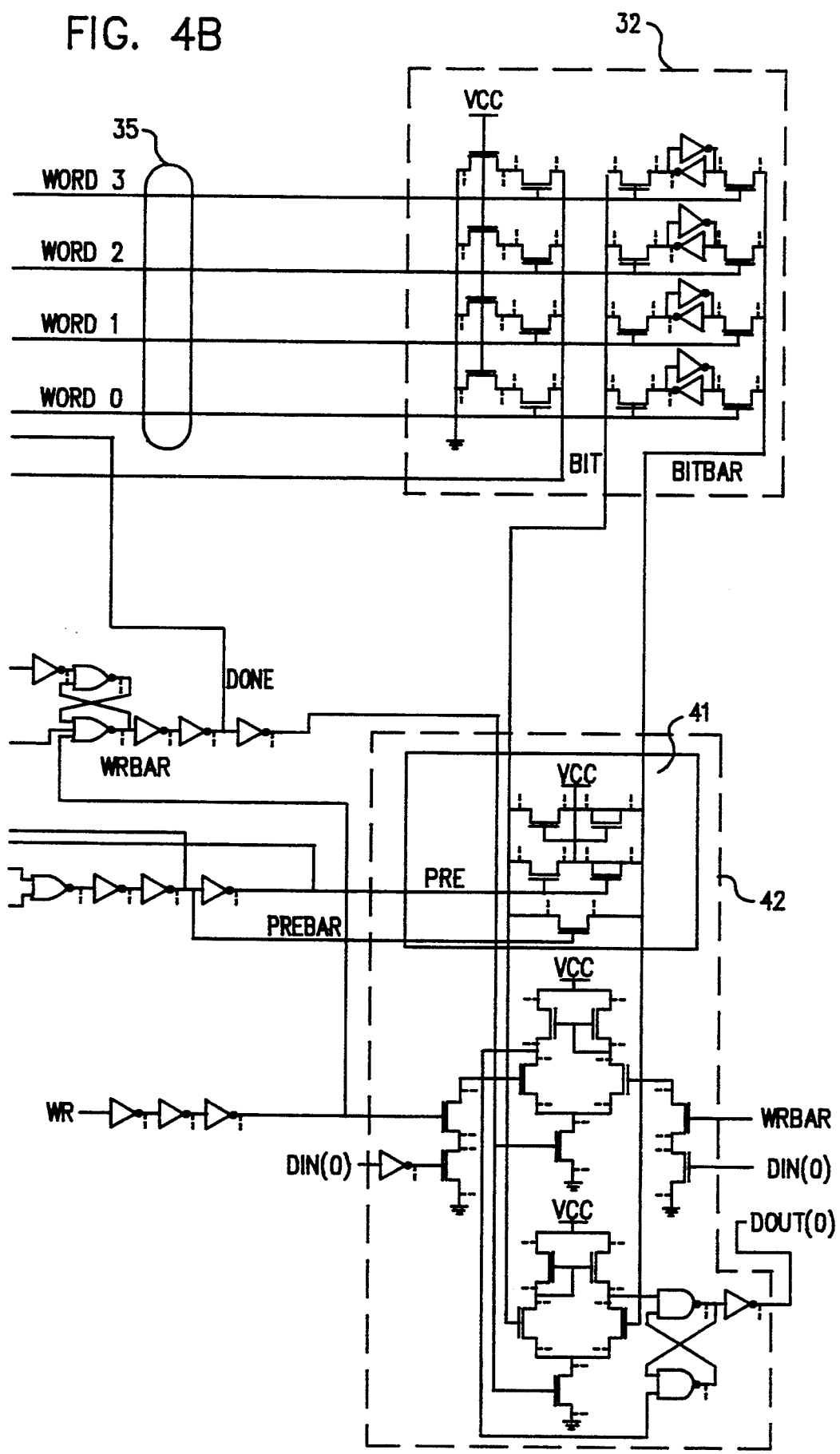

FIG. 4 is a schematic diagram showing the relative placement of FIGS. 4A and 4B. FIGS. 4A and 4B are respectively first and second portions of a schematic diagram of a four word by one-bit static RAM of the form described above in FIG. 3. The memory cell array 32 is connected to the row decode 34 by word lines 35. The address translation detection 38 communicates row decode signals 37 (A0, A0bar, A1, and A1bar) to the row decode 34. The ATD 38 also passes ATD signals 39 from the precharged buffers 40 through precharged amplifiers 41 to the memory cell array 32. In this case, the column decode 36 is unnecessary because the memory cell array 32 includes only one column. The sense amplifiers 42, which are vertically aligned with the column decode 36 in the precharged amplifiers 41, pass data to be stored from an external source to the selected memory cells in the memory cell array 32 and receive retrieve data from designated memory cells in the memory cell array 32. The precharged amplifiers 41 produce the charge required to store a charge representing a "1" in a designated memory cell in the memory cell array 32.

COMPILE AND LINK EDITOR

The geometry, simulation model, and schematic symbol source codes 60, 62 and 64, respectively, are compiled and linked (if the latter two codes have been written) using the computer system's "C" compile and link editor 66 to produce the executable module compiler 68. The compiler 68 then produces geometry and schematic symbol database generators 65 and 67, a simulation model generator 69 and a transistor model generator 70. These databases are the embodiment of the IC module created. They may be scrutinized by debugging programs, viewed and plotted as geometry, and ultimately converted to a format for mask work generation. To plot the IC module and layout, the database for the geometry generator 69 is transformed into a format readable by the plotter. The layout of the module is then plotted layer by layer, including the port and node labels.

Figure 5:
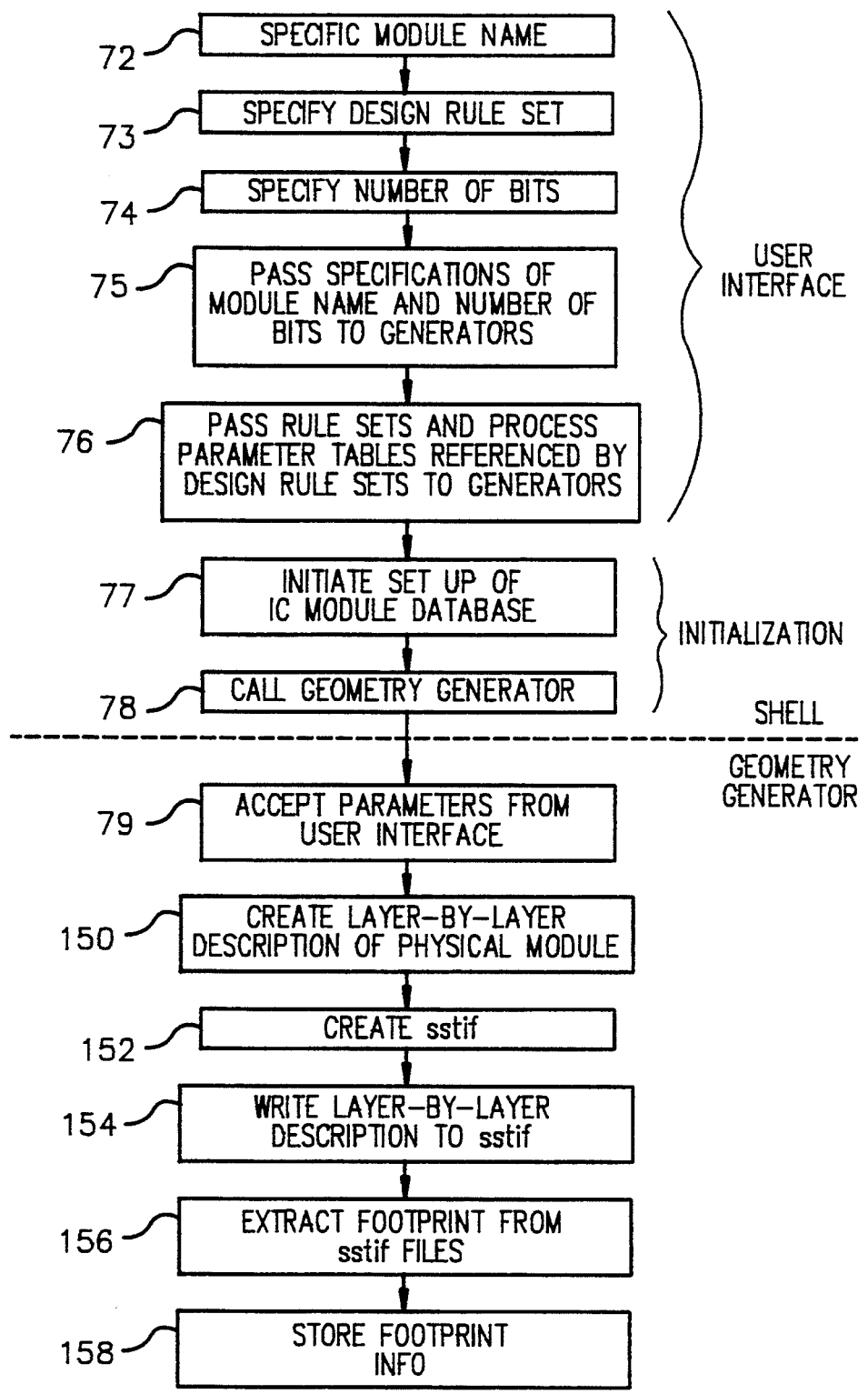
FIG. 5 is a flow chart for compiling an integrated circuit module generator using the apparatus of FIG. 1.
Figure 6:
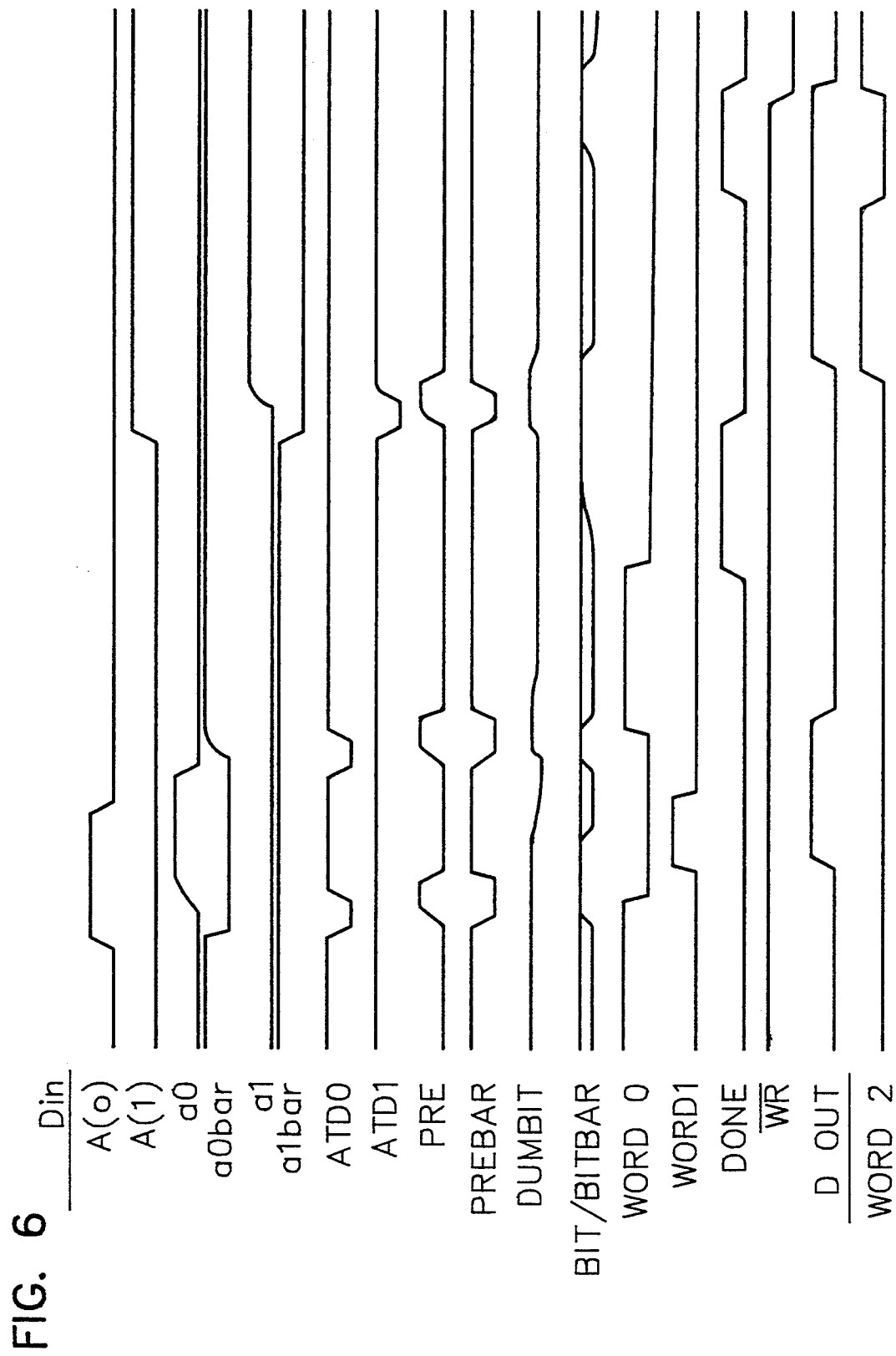
FIG. 6 is a timing diagram explaining basic operations of the RAM of FIG. 4.

FIG. 5 is a flow chart showing the steps performed by the compiler-link editor 66 when generating the executable module compiler 68 for producing the integrated circuit layout geometry. The module compiler 68 consists of up to five elements: a shell 71, the geometry 65 generator, the simulation model generator 69, the transistor model generator 70, and the schematic symbol generator 67. The generator shell 71 consists of a user interface, initialization routines, and, possibly, a scanner, parser, and error handler. In the user interface of the generator shell 71, it can be seen that the user specifies module name (step 72), design rule set (step 73), and, where applicable, numerical data, such as the number of bits required (step 74). In the example of a random access memory, the number of words and the number of bits per word must be specified. In step 75, the generator shell passes the specifications of module name and number of bits to the geometry, simulation model, transistor model, and schematic symbol generators (65, 69, 70 and 67, respectively). Rule set and process parameter tables referenced by the specified design rule set (step 73) are passed to the generators (65, 67, 69, 70) in step 76. Entering its initialization routines, the generator shell 71 then initiates the setup of the integrated circuit module database (step 77).

TECHNOLOGY DESIGN RULE SPECIFICATION

At the time of compilation, the design rule variables are fixed at given values, thereby generating a specific version of the integrated circuit layout for the module under development. The design rule variables are defined in the form of a data file accessed during execution. If a version of the module is needed in a different rule set, a design rule variable file containing these new values can be substituted for the original file. The module compiler 68 can produce the geometry simulation model, schematic symbol and transistor model generators (65, 69, 67 and 70, respectively) embodying the constraints as specified for any given design rule set.

Figure 8B:
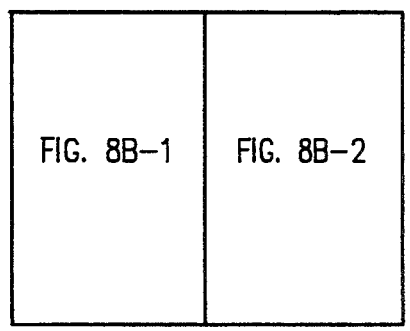
FIG. 8B is a schematic diagram showing the relative placement of FIGS. 8B-1 and 8B-2.
Figure 7A:
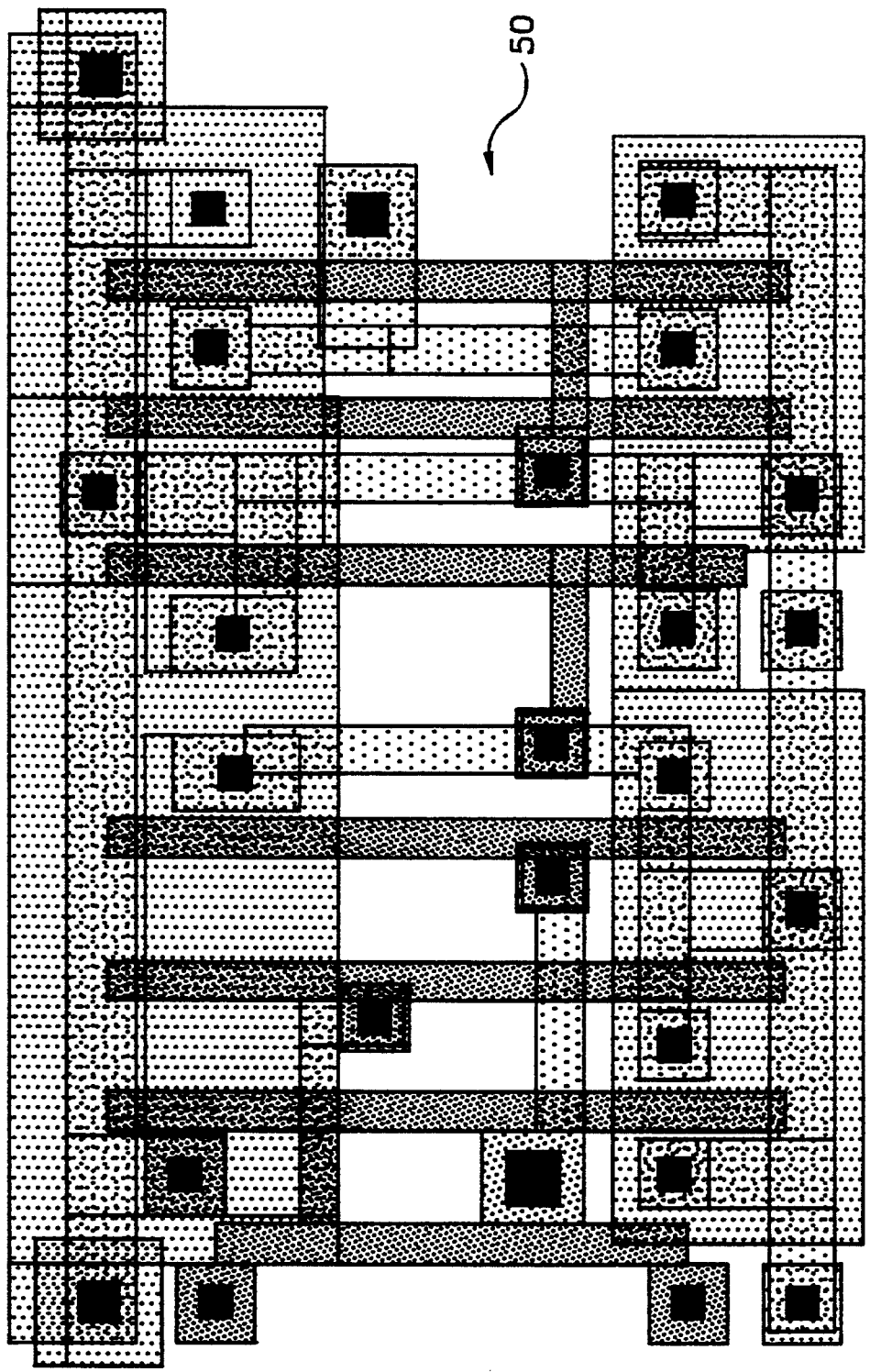
FIG. 7A is a layout of a portion of a four word by one-bit, single-port RAM according to FIGS. 3 and 4.
Figure 7B:
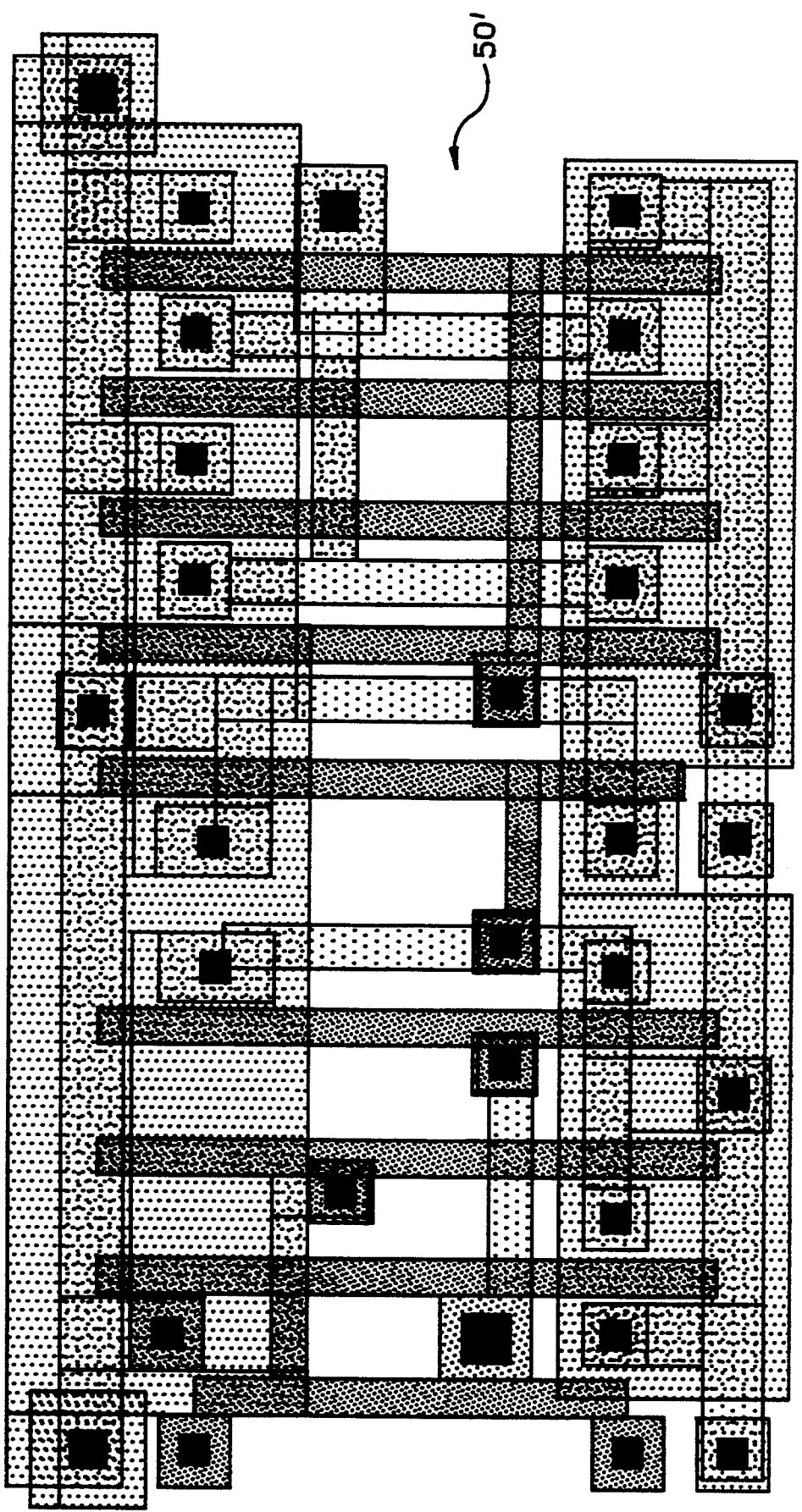
FIG. 7B is a layout of a portion of a four word by 64-bit, single-port RAM according to FIG. 3.
Figure 8A:
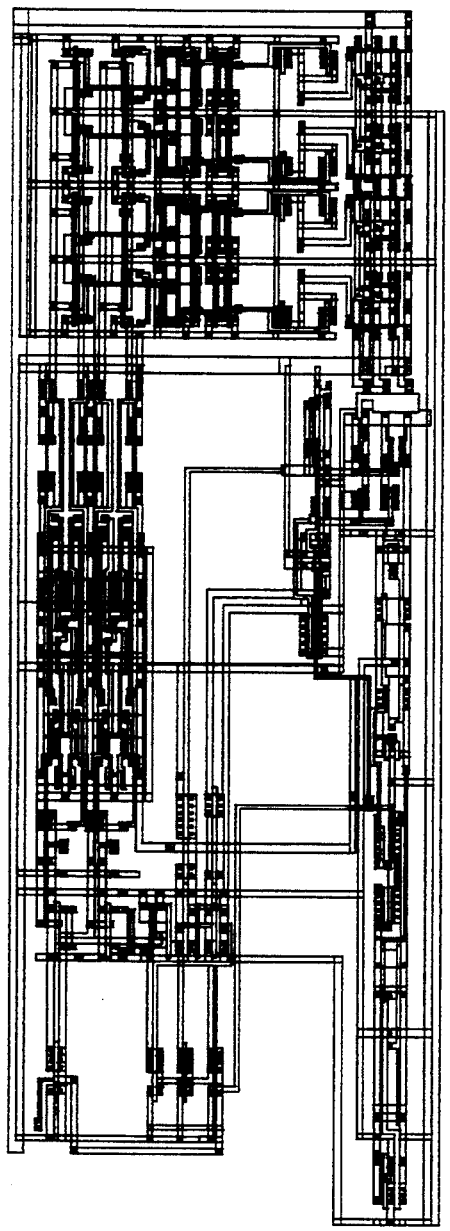
FIG. 8A is the metal layer mask of a four word by one-bit, single-port RAM as shown in FIGS. 3 and 4.
Figures 1, 8B:
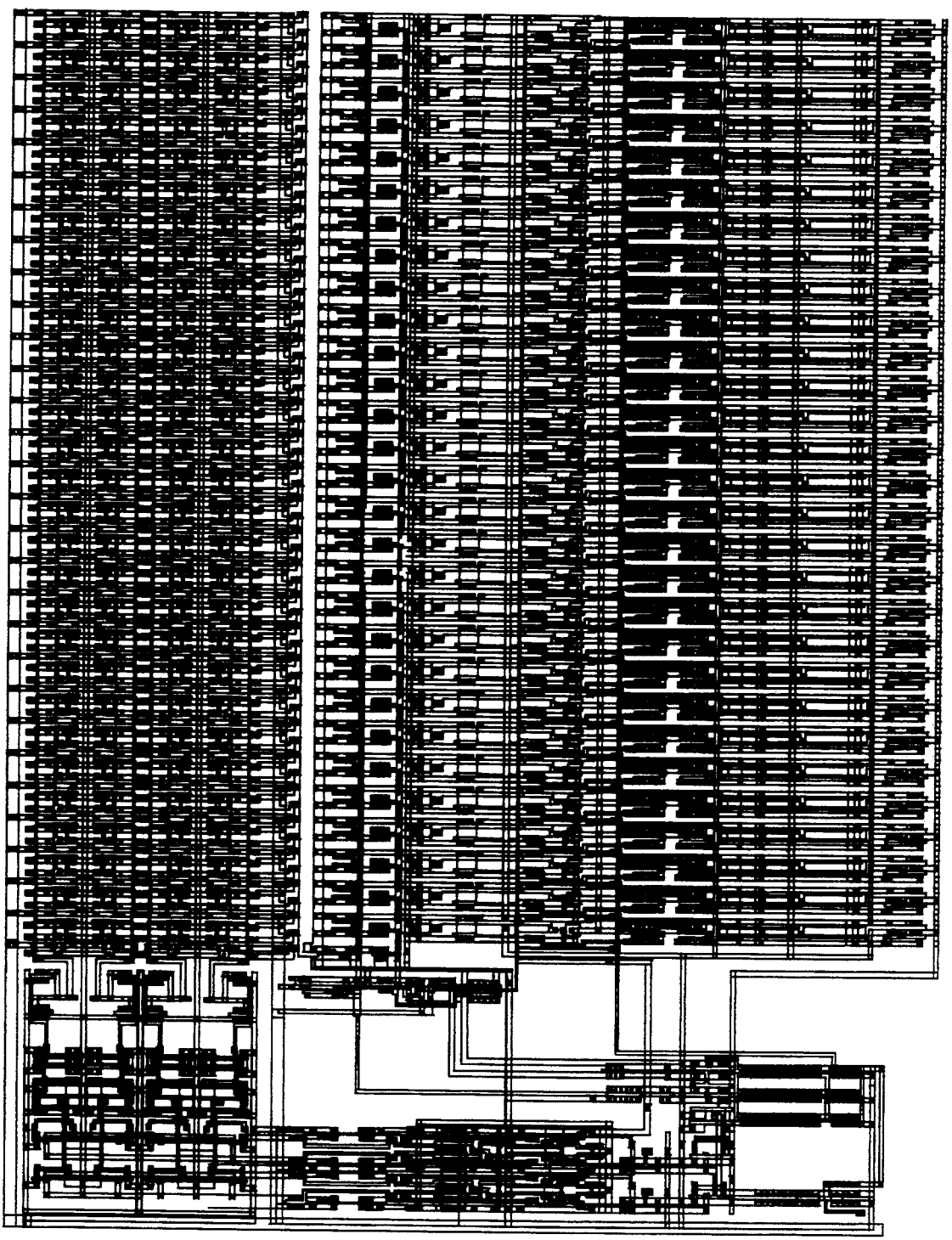
Figures 2, 8B:

The sizing subroutines shown in Table 1 account for changes in driving requirements imposed when the process technology of a particular foundry and the size of the desired RAM are chosen. The effects of these choices are illustrated in FIGS. 7A and 7B. FIG. 7A illustrates one-word line driver 34A (see FIG. 5) when it is sized to drive a one-bit word. FIG. 7B illustrates the change in the word line driver 34A when a word is chosen to be 64-bits long. By comparison of FIGS. 7A and 7B, it can be seen that the amplifier stage 50' includes a substantially larger driving transistor than does the stage 50 which is shown in FIG. 7A. The sizing effect is further shown by comparison of FIGS. 8A and 8B-1-2. FIG. 8B is a schematic diagram showing the relative placement of FIGS. 8B-1 and 8B-2. FIGS. 8B-1 and 8B-2 are respectively first and second portions of the metal layer mask of a four word by 64-bit, single-port RAM according to FIG. 3. Both figures illustrate the metal mask layer of four-word static RAM cells as described above. When the words are each only one-bit wide, however, as in FIG. 8A, the power rails and busses can be considerably smaller than the corresponding power rails and busses if the words are 64-bits wide, as in FIG. 8B.

As an example, the RAM power rail sizing is determined by the computer code which is found in Table 2, below. It calculates the size of the power rails based on the number of bits per word and the number of columns per word. The variable IDS_target is the current generated by a one-bit line pullup. The total current is then calculated based on bpc, the number of bits per column, and bpw, the number of bits per word.

Next, ram_cur_density is obtained from the process technology database. This value is important. It represents the maximum amount of current that can flow through a unit width of wire in the RAM cell. If this value is exceeded, the RAM may fail prematurely. The bus size is then calculated by dividing the total current by the current density. Table 3 contains examples of power rail sizes for three rulesets describing three different foundries.

TABLE 2

```
INT 32 ram2_midvdd(bpw,bpc)
INT32 bpw, bpc;
{
INT32 midbus_size, temp;
float total_cur, vds,vgs,vbs, ram_cur_density;
double IDS_target;
    midbus_size = 0;
    vdsw = 2.5;          /* NOISE margin on prod term
                            lines = vds*/
    vgs = 5.0;           /* voltage gate to source */
    vbs = 0.0;           /* bulk to source tied together
    /* Figure current for pullups */
    IDS_target
DC_current('n',PGEO,25.0,pyw,ba,vgs,vds,vbs);
    /* Calculate total current */
    total_cur = 2*&bpw*bpc*IDS_target)*1000/4;
    /* Calculate the width of the VDD rail for static
devices */
    ram-cur_density = gparam("l_metal",PGEO);
    midbus_size = ((INT32)(total_cur
    /ram_cur density)*geoUnitsPerMicron);
    midbus_size = MAX(midbus_size, bm);
    midbus size = MAX(midbus_size, 2*mlov+2*vw+vs);
    midbus size = snp up(midbus_size);
    temp = snp_up(midbus_size/2);
    midbus_size = 2*temp;
    return(midbus_size);
}
```

TABLE 3

| Ruleset: ric1u2m1p |
| --- |
| Columns = 1, Rail = 8 microns |
| Columns = 2, Rail = 8 microns |
| Columns = 4, Rail = 8 microns |
| Columns = 8, Rail = 8 microns |
| Columns = 16, Rail = 10 microns |
| Columns = 32, Rail = 20 microns |
| Columns = 64, Rail = 41 microns |
| Columns = 128, Rail = 83 microns |
| Columns = 256, Rail = 167 microns |
| Ruleset: ami1u2m1p |
| Columns = 1, Rail = 9 microns |
| Columns = 2, Rail = 9 microns |
| Columns = 4, Rail = 9 microns |
| Columns = 8, Rail = 9 microns |
| Columns = 16, Rail = 13 microns |
| Columns = 32, Rail = 27 microns |
| Columns = 64, Rail = 54 microns |
| Columns = 128, Rail = 109 microns |
| Columns = 256, Rail = 218 microns |
| Ruleset: mot2u2m1p |
| Columns = 1, Rail = 9 microns |
| Columns = 2, Rail = 9 microns |
| Columns = 4, Rail = 9 microns |
| Columns = 8, Rail = 9 microns |
| Columns = 16, Rail = 9 microns |
| Columns = 32, Rail = 16 microns |
| Columns = 64, Rail = 32 microns |
| Columns = 128, Rail = 65 microns |
| Columns = 256, Rail = 131 microns |

Similarly, the RAM word line buffer can be sized, as shown in Table 4. The function in Table 4 calculates the size of the word line buffer based on the size of the RAM and the process ruleset. The variable capcal is the capacitance on one transistor. The variable capload is the total load on the word line buffer. The buffer size that is required to drive the total load indicated by the value of capload is then calculated. The data in Table 5 show the word line capacitance, buffer size, and delay for three different rulesets.

TABLE 4

```
/*****************************************
 * Function: ram2_word_sizer()            *
 *****************************************/
INT32   ram2_word_sizer(loads)
INT32   loads;
{
INT32   capcal, cap_load, buf_size, fanout;
        if((0 < loads) && (rows < 32))
            fanout = 8;
        else if((33 < loads) && (loads < 64))
            fanout = 10;
        else
            fanout = 12;
        capcal = C_calc(ba,pyw,0,0);
        cap_load =
            2*loads*capcal + C_metal2(loads*3*2v,mw);
        buf_size = buf_size2(cap_load,fanout);
        buf_size = MIN(buf_size,6);
        return(buf_size);
}
```

TABLE 5

| Ruleset: ric1u2m1p |
|---|
| Columns=2,0utcap=35,Buffer=1,DELAY=611 |
| Columns=4,0utcap=70,Buffer=1,DELAY=710 |
| Columns=8,0utcap=139,Buffer=1,DELAY=904 |
| Columns=16,0utcap=276,Buffer=1,DELAY=1289 |
| Columns=32,0utcap=552,Buffer=1,DELAY=2066 |
| Columns=64,0utcap=1104,Buffer=1,DELAY=2132 |
| Columns=128,0utcap=2207,Buffer=1,DELAY=2293 |
| Columns=256,0utcap=4379,Buffer=1,DELAY=2953 |
| Ruleset: ami1u2m1p |
| Columns=2,0utcap=44,Buffer=1,DELAY=408 |
| Columns=4,0utcap=88,Buffer=1,DELAY=507 |
| Columns=8,0utcap=176,Buffer=1,DELAY=706 |
| Columns=16,0utcap=351,Buffer=1,DELAY=1101 |
| Columns=32,0utcap=702,Buffer=2,DELAY=1159 |
| Columns=64,0utcap=1403,Buffer=3,DELAY=1481 |
| Columns=128,0utcap=2806,Buffer=5,DELAY=1814 |
| Columns=256,0utcap=5567,Buffer=9,DELAY=2190 |
| Ruleset: mot2u2m1p |
| Columns=2,0utcap=81,Buffer=1,DELAY=1207 |
| Columns=4,0utcap=162,Buffer=1,DELAY=1596 |
| Columns=8,0utcap=323,Buffer=11,DELAY=2369 |
| Columns=16,0utcap=646,Buffer=1,DELAY=3921 |
| Columns=32,0utcap=1290,Buffer=2,DELAY=4167 |
| Columns=64,0utcap=2580,Buffer=3,DELAY=5405 |
| Columns=128,0utcap=5159,Buffer=5,DELAY=6691 |
| Columns=256,0utcap=10237,Buffer=9,DELAY=8121 |

The system can also accommodate pitch matching. Pitch matching is accomplished in three distinct steps. Two of the pitch matching steps are performed in the X direction and one is performed in the Y direction. One of the two X direction pitch matching steps is determined by the largest X dimension of each of the corresponding features in the row decode 34 and the ATE) 38. All of the other corresponding features are then given this same maximum X dimension. Similarly, in the second X dimension pitch matching, all corresponding features in the memory cell array 32, the column decode 36, and the sense amplifiers 42 are compared and their X dimensions adjusted so that they all equal the X dimension of the largest feature. The pitch matching comparison in the Y direction is performed among corresponding features in the RAM cell array 32 and the row decode 34. Here, the largest Y dimension of all corresponding features is determined and all other features are adjusted to have this same maximum Y dimension.

Figure 9A:
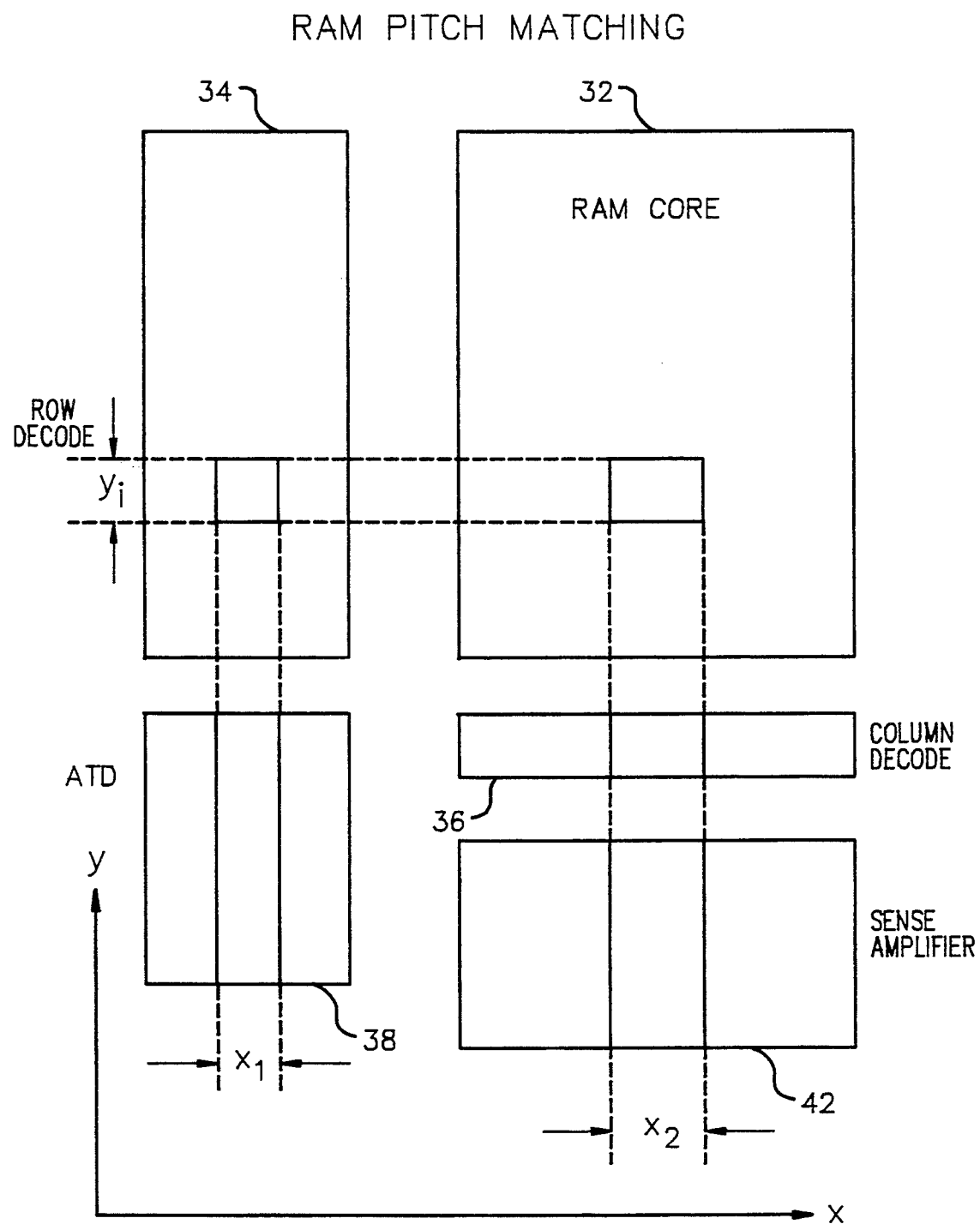
FIG. 9A is a schematic diagram showing the application of the first step of pitch matching to the single-port RAM of FIG. 3.
Figure 9B:
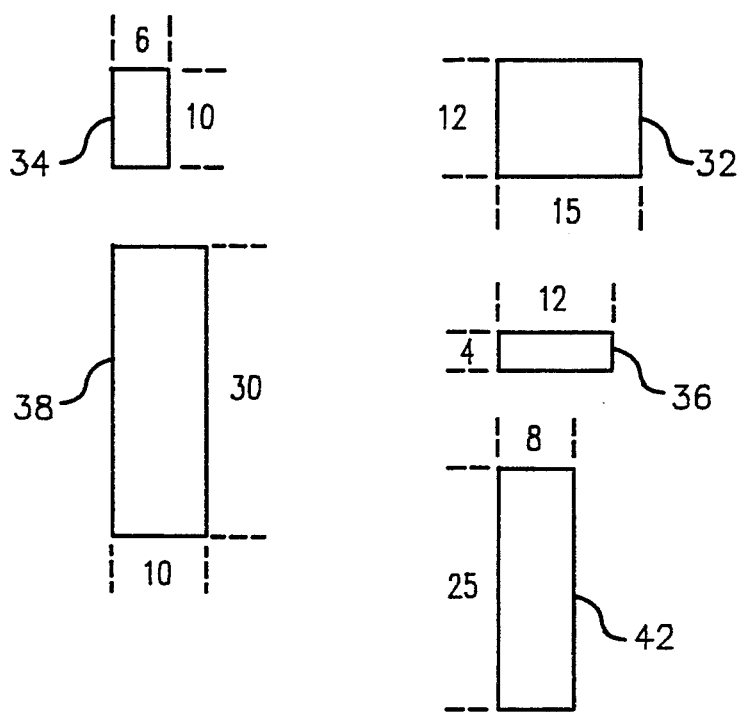
FIG. 9B is a schematic diagram showing the application of the second step of pitch matching to the single-port RAM of FIG. 3.

An illustration of this procedure is shown in FIG. 9B. In FIG. 9B, a feature in row decode 34 having a horizontal dimension of six corresponds to a feature in the ATD 38 having a horizontal dimension of ten. The horizontal dimension of the corresponding feature in row decode 34 is thereby increased from six to ten in order to assure that the horizontal pitch of the features in the row decode 34 corresponds to that in the ATD 38. The horizontal dimension of corresponding features in the memory cell array 32, the column decode 36, and the sense amplifiers 42 are respectively 15, 12, and 8. To ensure horizontal pitch matching of features in these subcomponents, the horizontal extent of each of these features is made equal to the horizontal extent of the largest of them. i.e., 15 units.

Figure 9C:
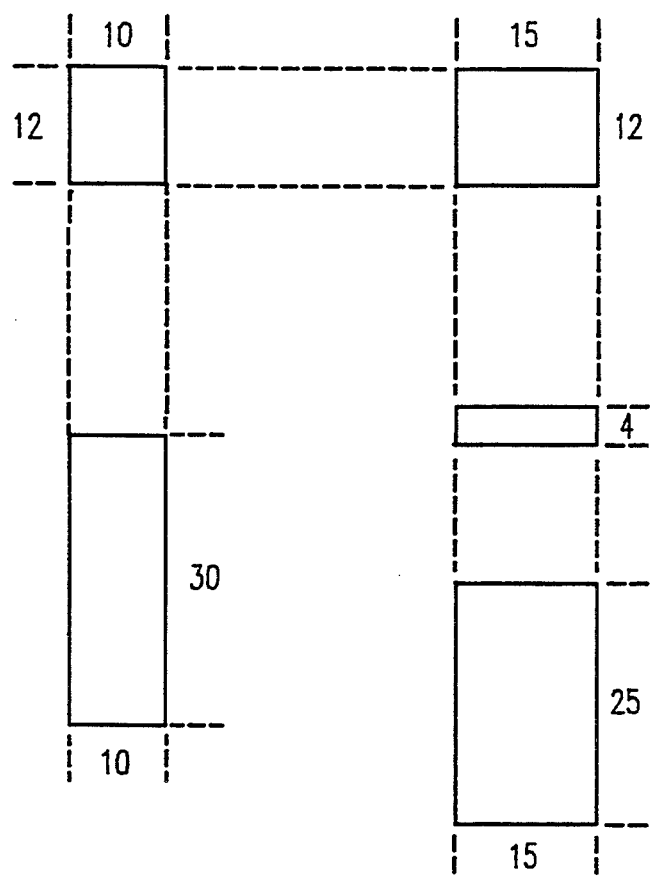
FIG. 9C is a schematic diagram showing the application of the third step of pitch matching to the single-port RAM of FIG. 3.

Finally, the vertical extent of corresponding features in row decode 34 and RAM cell array 32 are compared and made equal. Accordingly, the vertical extent of the feature in the row decode 34 is increased from 10 to 12 in order to equal the vertical extent of the feature in the RAM cell array 32. The result of these pitch matching operations is shown in FIG. 9C.

An example of the code used to cause pitch matching is shown in Table 6. This code calculates the maximum pitch for an X constraint $x_2$ in the RAM array. It is necessary to analyze five different cases of memory cell array aspect ratio. For an aspect ratio of 1 bit per column, the pitch is set based on the width of the precharge cell and the width of the sense amplifier. For an aspect ratio of 2 bits per column, the pitch is set based on a different type of sense amplifier. For an aspect ratio of four bits per column, the pitch is based on the sum of the sense amplifier widths as used in the two bits per column analysis plus another cell. That cell is a set of four two input NAND gates or four inverters. The sum is divided by four and maximized with the ram cell width. For the 8 bit per column and sixteen bit per column cases, several cells are compared: the sense amplifier cell plus two ram_fto() cells or eight or sixteen two input NOR gates. The sum is divided by eight or sixteen, depending on bits per column and maximized with the RAM cell width.

TABLE 6

```
INT32   ram2_cell_xpitch(bpw,bpc)
INT32   bpw, bpc;
{
dmCELL  cellname;
INT32   xpitch, pre_cell_width, sense_width,
        sense_fto_width, colinv_widthi, colir
        ram_ft_width, templ, temp2, temp3, temp4;
/** Cell precharge cell to get cell width **/
cellname = ram2_precharge(bpw,bpc);
pre_cell_width =
    getx(cellname,"ram_pcharge_width");
geoFlush(cellname);
switch(bpc){
    case 1:
        /** Cell senseamp to get cell width **/
        cellname = ram_sense(l,bpc,FALSE);
        sense_width =
            getx(cellname,"sense width");
        geoFlush(cellname);
        templ = MAX(v2m2,ac2ac);
        templ = MAX(templ,2*ac2py);
        templ = MAX(templ,py2pyc+dpyc);
        templ = MAX(templ,v2mad);
        xpitch = MAX(pre_cell_width,
            sense_width+templ);
        break;
    case 2:
        /** Cell senseamp to get cell width **/
        cellname = ram_sense2(l,bpc,FALSE);
        sense_width =
            getx(cellname,"sense_width");
        geoFlush(cellname);
        templ = MAX(v2v,ac2ac);
```

TABLE 6-continued

```
      temp1 = MAX(templ,pyc2pyc);
      temp2 = (sense_width + temp1)/2;
      temp2 = snp_up(temp2);
      xpitch = MAX(pre_cell_width,temp2);
    break;
    case 4:
      /** Cell senseamp to get cell width **/
      cellname = ram_sense2(l,bpc,FALSE);
      sense_width =
        getx(cellname,"sense_width");
      sense_fto_width =
        getx(cellname,"sense_fto_width");
      geoFlush(cellname);
      cellname = ram2_fto(1,FALSE);
      ram_fto_width =
        getx(cellname,"ram_fto_width:");
      geoFlush(cellname);
      /**Call colinvert to get cell width **/
      cellname = ram2_colinvert(bpw,bpc);
      colinv_width2 =
        getx(cellname,"colinv_width2");
      geoFlush(cellname);
      temp1=sense_fto_width + ram_fto_width;
      temp2=MAX(v2v,py2pyc+MAX(ac2py,v2py));
      temp2 =MAX(temp2,v2py+MAX(ac2py,v2py));
      temp2=MAX(temp2,ac2py+MAX(ac2py,v2py));
      temp2 =MAX(temp2,bm2m+v2m);
      temp2 =MAX(temp2,2*bm2m);
      temp2 =MAX(temp2,2*noac+nns);
      temp2 =MAX(temp2,2*poac+pps);
      temp3=sense_width + 2*temp2 +
        2*colinv_width2 + py2py
      temp4=((MAX(templ,temp3)) / bpc);
      temp4=snp_up(temp4);
      xpitch = MAX(pre_cell_width,temp4);
    break;
    case 8:
    case 16:
      /** Cell senseamp to get cell width **/
      cellname = ram_sense2(1,bpc,FALSE);
      sense_width =
        getx(cellname,"sense_width");
      sense_fto_width =
        getx(cellname,"sense_fto_width");
      geoFlush(cellname);
      cellname = ram2_fto(1,FALSE);
      ram_fto_width =
        getx(cellname,"ram_fto_width:");
      geoFlush(cellname);
      /**Call colinvert to get cell width **/
      cellname = ram2_colinvert(bpw,bpc);
      colinv_width1 =
        getx(cellname,"colnor_width1");
      colinv_width2 =
        getx(cellname,"colnor_width2");
        geoFlush(cellname);
      temp1 =sense_fto_width + ram_fto_width;
      temp2=MAX(v2v,py2pyc+MAX(ac2py,v2py));
      temp2 =MAX(temp2,v2py+MAX(ac2py,v2py));
      temp2=MAX(temp2,ac2py+MAX(ac2py,v2py));
      temp2 =MAX(temp2,bm2m+v2m);
      temp2 =MAX(temp2,2*bm2m);
      temp2 =MAX(temp2,2*noac+nns);
      temp2 =MAX(temp2,2*poac+pps);
      temp3=sense_width + 2*temp2 +
        2*colinv_width2 + 2*colinv_width1
        + 3*(py2pycm+dpycm);
      temp4=((MAX(temp1,temp3)) / bpc);
      temp4=snp_up(temp4);
      xpitch = MAX(pre_cell_width,temp4);
    break;
}
return(xpitch);
```

After the size and spacing of each of the features of a particular layout are determined, the system calculates the connectivity of each of the features and generates a simulation model of the timing performance of each of the models in accordance with its size and connection to adjoining features. This model includes the subroutines shown in Table 1 and uses the subroutines to calculate currents and corresponding sizes for features in the RAM cells, the ground bus, the ATD, and the word-line buffer. An example of a RAM transistor model is shown in Table 7. These subroutines also calculate the internal operating points of the sense amplifiers 42 in order to improve the accuracy of the simulation model.

TABLE 7

```
SPICECONVERT ON CELL: ram1
***************************
Cell: t167s0
gate = 3
source = 4
drain = 5
LOCAL NETS
.SUBCKT CKT1 1 2 3 4 5
MN 5 3 4 2 NMOS W=2.95U L=1.50U
.ENDS
***************************
Cell: t167s1
gate = 3
source = 4
drain = 5
LOCAL NETS
.SUBCKT CKT2 1 2 3 4 5
MN 5 3 4 2 NMOS W=3.95U L=1.50U
.ENDS
***************************
Cell: ram1
.EQUIV Vdd = 1
.EQUIV GND = 2
.EQUIV A(0) = 3
.EQUIV A(1) = 4
.EQUIV Din(0) = 5
.EQUIV Dout(0) = 6
.EQUIV Wr = 7
$ LOCAL NETS
$ word0 = 8
$ word1 = 9
$ word2 = 10
$ word3 = 11
$ pre = 12
$ prebar = 13
$ prein = 14
$ wr = 15
$ done = 16
.SPICE
.BIPOLAR
.CAPA
.RESISTOR=1
.EQUIV N=NMOS P=PMOS
.SUBCKT RAM1 1 2 3 4 5 6 7
.XARRAY 1 2 8 9 10 11 15 12 13 16 5 6 CKT23
.XDECODER 1 2 14 16 8 9 10 11 3 4 CKT33
.XPREBUFN 1 2 14 13 12 CKT34
.XWRBUFNA 1 2 7 15 CKT35
.ENDS
```

After these models have been generated, they are available to a person using the system for the purposes of assuring that the subcircuit of the integrated circuit that is being designed is connected as desired and has satisfactory performance.

While the foregoing detailed description has used an exemplary RAM, those skilled in the art will appreciate that the same steps and apparatus can be used to design other subcircuits, including producing a layout that is a function of process technology parameters and user-input parameters such as word sizes. This method and apparatus will also account for proper sizing and alignment of features within subcomponents of the subcircuit and will generates both connectivity and timing models so that the user can assess the correctness and performance of the resulting layout. For example, the steps and apparatus described above can be used to design a two-port RAM whose architecture will be well understood by those skilled in the art when given the architecture of a single-port RAM, as in FIG. 3.

While a preferred embodiment of this invention has been described, the invention is capable of modification and addition without departing from its basic principles. Accordingly, the invention is not intended to be limited to the exact embodiment illustrated, which is presented only as an example. The scope of the invention should be determined by reference to the claims and their equivalents, interpreted in light of the prior art.

We claim:

1. A computer implemented method for designing the layout of a subcircuit on an integrated circuit, the layout comprising one or more layers of circuit features subject to one or more constraints, including geometric constraints, the subcircuit including internal cells and the layers being formed with respect to a two-dimensional surface of a substrate in accordance with a specified process technology, the method comprising the steps of:
   a. establishing the constraints among the layers of circuit features that are determined by the specified process technology;
   b. creating a description of a layout geometry for the subcircuit according to the constraints;
   c. using a computer to generate one or more simulation models for the described layout geometry; and
   d. using a computer to generate a connectivity test model for the described layout geometry.

2. The method of claim I wherein step b further includes sizing the internal cells to optimize performance.

3. A computer implemented method for designing the layout of a random access memory on an integrated circuit, the layout comprising one or more layers of circuit features subject to one or more constraints, including geometric constraints, the random access memory including internal cells, such as one or more sense amplifiers, internal buffers and power rails, the layers being formed with respect to a two-dimensional surface of a substrate in accordance with a specified process technology, the method comprising the steps of:
   a. establishing the constraints among the layers of circuit features that are determined by the specified process technology;
   b. creating a description of a layout geometry for the random access memory according to the constraints;
   c. using a computer to generate one or more simulation models for the described layout geometry; and
   d. using a computer to generate a connectivity test model for the described layout geometry.

4. The method of claim 3 wherein step b further includes pitch matching the internal cells of the random access memory.

5. The method of claim 3 wherein step b further includes sizing the internal buffers to optimize performance.

6. The method of claim 3 wherein step b further includes sizing the power rails to increase reliability.

7. The method of claim 3 wherein step c further includes sizing the sense amplifiers to maximize operating margins and speed of the random access memory.

8. The method of claim 3 wherein step c further includes calculating internal operating points of sense amplifiers in the random access memory.

9. A computer based apparatus for designing the layout of a subcircuit on an integrated circuit, the layout comprising one or more layers of circuit features subject to one or more constraints, including geometric constraints, the subcircuit including internal cells and the layers being formed with respect to a two-dimensional surface of a substrate in accordance with a specified process technology, the apparatus comprising:

means for electronically inputting into a computer the circuit feature positions, a plurality of variables, each variable functionally corresponding to a constraint among the layers of circuit features, and a plurality of constants, each constant corresponding to a specific value for one of the variables;

memory storage means operatively associated with the means for electronically inputting for storing descriptions of the circuit feature positions, the plurality of variables, and the plurality of constants; and computer processing means operatively associated with the means for electronically inputting and the memory storage means for establishing the constraints that are determined by the specified process technology, for creating a layout geometry for the subcircuit according to the constraints, for generating one or more simulation models for the described layout geometry and for generating a connectivity test model for the described layout geometry.

* * * * *